(12) United States Patent
Huiusman et al.

(10) Patent No.: US 8,155,274 B2
(45) Date of Patent: Apr. 10, 2012

(54) METHOD AND SYSTEM FOR MONITORING AND IMPROVING THE QUALITY OF INTERCONNECTING CABLING SYSTEMS

(75) Inventors: Wilhelmus Marinus Huiusman, Ede (NL); Johannes Theodorus Maria Kuijpers, Kapel Avezaath (NL); Reinier Bernardus Moree, Rotterdam (NL)

(73) Assignee: Koninklijke KPN N.V., The Hague (NL)

( * ) Notice: Subject to any disclaimer, the term of this patent is extended or adjusted under 35 U.S.C. 154(b) by 1332 days.

(21) Appl. No.: 11/667,608

(22) PCT Filed: Nov. 10, 2005

(86) PCT No.: PCT/EP2005/012188
§ 371 (c)(1),
(2), (4) Date: May 11, 2007

(87) PCT Pub. No.: WO2006/050985
PCT Pub. Date: May 18, 2006

(65) Prior Publication Data
US 2007/0297346 A1      Dec. 27, 2007

Related U.S. Application Data

(60) Provisional application No. 60/627,663, filed on Nov. 12, 2004.

(51) Int. Cl.
*H04M 1/24* (2006.01)
*H04M 3/08* (2006.01)
*H04M 3/22* (2006.01)

(52) U.S. Cl. .................. 379/9.02; 379/9.04; 379/10.01; 379/12; 379/22; 379/29.09

(58) Field of Classification Search ................ 379/1.01, 379/9, 9.02, 9.03, 9.04, 10.01, 10.03, 15.01, 379/22, 22.03, 22.07, 25, 27.01, 29.01, 29.09, 379/29.1, 12, 23
See application file for complete search history.

(56) References Cited

U.S. PATENT DOCUMENTS

| | | | | |
|---|---|---|---|---|
| 5,802,143 | A * | 9/1998 | Borchering et al. | 379/33 |
| 5,920,610 | A * | 7/1999 | Arami et al. | 379/32.01 |
| 5,953,389 | A | 9/1999 | Pruett et al. | 379/9 |
| 6,002,746 | A * | 12/1999 | Mulcahy et al. | 379/22 |
| 6,233,449 | B1 | 5/2001 | Glitho et al. | 455/423 |
| 6,771,739 | B1 | 8/2004 | Beamon et al. | 379/9.03 |
| 7,502,327 | B2 * | 3/2009 | Burns et al. | 370/241 |
| 7,631,064 | B1 * | 12/2009 | Gray | 709/224 |

FOREIGN PATENT DOCUMENTS
WO   WO 2004/044599   5/2004

* cited by examiner

*Primary Examiner* — Binh Tieu
(74) *Attorney, Agent, or Firm* — Michaelson & Associates; Peter L. Michaelson

(57) ABSTRACT

System for coordinating the use of a mapping system comparing the physical connection status of a cable link in a network with the administrative data about said cable link in the network administration. The coordinating system uses data from one or several existing databases. Based on an analysis of the data retrieved from the one or more databases the system generates a detailed work order for an engineer to perform measurements with a mapping system. A mapping system is a system that performs measurements on the connections within a telecommunication network and compares the results of these measurements with the data in one of the databases. Differences are analyzed by the coordinating system.

6 Claims, 2 Drawing Sheets

METHOD AND SYSTEM FOR MONITORING AND IMPROVING THE QUALITY OF INTERCONNECTING CABLING SYSTEMS

CROSS REFERENCE TO RELATED APPLICATIONS

This patent application is a U.S. National Stage application of and claims priority under 35 U.S.C §371 from international PCT Patent Application No. PCT/EP2005/012188 filed Nov. 10, 2005, which in turn is related to and claims priority from U.S. Provisional Patent Application No. 60/627,663, filed Nov. 12, 2004, the contents of both of which are incorporated herein by reference in their entirety.

FIELD OF THE INVENTION

The present invention pertains to interconnecting cabling systems and, more specifically, to monitoring and improving the way such systems are managed and maintained.

BACKGROUND OF THE INVENTION

Interconnecting cabling systems, such as telecommunication networks, consist of numerous lines. The physical embodiments of such lines include copper-wire cables and fiber-optic cables between different points in the network, like switches and patch panels.

The cabling system owners, such as telecom operators, maintain their networks with the help of administrative systems that represent the networks in databases. As the physical networks expand, it becomes increasingly complex to perform network administration in a database, with a growing likelihood of differences occurring between the physical network and the administrative data. This obviously confronts the network manager with a problem.

WO2004/044599 discloses a system and method for automatically obtaining the connectivity status, or map, of a cabling system in a data and/or voice network. This provides the possibility of comparing the physical reality with the administrative data A known problem with existing systems for measuring and comparing the actual connectivity status of a cable link to the administrative database, further referred to as "mapping system", is that today's networks comprise too many lines to allow the mapping of all lines for the purpose of comparing physical status to administrative data for network management purposes. So to use a mapping system efficiently a selection of links to be measured at a given point in time has to be made. Existing mapping systems lack the ability to support this selection of relevant lines. And the human network manager has to make this selection.

Another problem encountered with existing systems is that it remains unclear what action needs to taken when a discrepancy is detected between the status of the physical line and the administrative data. Sometimes the administrative data has to be "cleaned"; sometimes the physical line has to be repaired. Existing systems only detect a difference, but cannot provide information with regard of the possible cause of the difference.

PROBLEM DEFINITION

The prior art fails to disclose a system and method for coordinating the use of a mapping system in the actual management and maintenance of an interconnecting cabling system.

AIM OF THE INVENTION

The aim of the invention is to provide a system and method for coordinating the use of a mapping system in the actual management and maintenance of an interconnecting cabling system.

SUMMARY OF THE INVENTION

A system is disclosed for automatically coordinating the use of a mapping system. A mapping system is used for comparing the physical connection status of a cable link in a network with the administrative data about the cable link in the network administration. Differences between the physical status and the administration are detected. A network can comprise large amounts of cable links.

According to an aspect of the invention the coordinating system comprises a planning module. The planning module automatically determines which cable link should be handled by the mapping system. This has the advantage that the mapping system can be used very efficiently, because the likelihood of using the mapping system for cable links where no differences will be detected decreases, without the interference of an human operator. Advantageously the planning module is linked to one or more existing databases. These databases can for instance comprise information with regard to utilization changes on all cable links within the network, or on the amount of after care resulting from subscriber complaints for all telephone numbers. The decision on what cable link should be handled by the mapping system can be based on the combination of the number of changes on a cable link and the amount of subscriber complaints. The coordinating system according to a first aspect of the invention can also comprise a work order module. Based on the decision from the planning module on what cable links need to be handled by the mapping system, the work order module generates a detailed work order. The work order comprises information needed to activate the mapping system. The work order can be sent to the mapping system directly, or can be printed out by an engineer, who will instruct the mapping system. The coordinating system can also comprise a data analysis module. This module will analyze the results from the mapping system and indicate what actions need to be taken to solve differences between the physical status of the cable link and the administrative data. The analysis module can for instance advice to adapt the administrative data, or to repair the physical situation.

Advantageously the coordinating system also comprises a management information module that will automatically generate reports about the activities of the system for management purposes. This has the advantage the management will always have up to date information with regard to the status of the network, and the quality of the network administration.

According to a second aspect of the invention a method is disclosed for coordinating the use of a mapping system comparing the physical connection status of a cable link in a network with the administrative data about the cable link in the network administration. The method can comprise the steps of automatically determining which cable link needs to be handled by the mapping system; the selection of the cable link selected for handling by the mapping system is advantageously based on information with regard the number of changes in the utilization of the cable link and on information with regard to the amount of after care caused by subscriber complaints; after the cable link has been determined the next step is generating a detailed work order to the mapping system; performing the measurements on the cable link with the mapping system and analyzing the results of the mapping system, resulting in actions to solve the differences reported by the mapping system.

BRIEF DESCRIPTION OF THE DRAWINGS

The present invention will be further explained below with reference to exemplary embodiments illustrated in the accompanying drawings, in which.

DETAILED DESCRIPTION OF THE INVENTION

Figure 1:
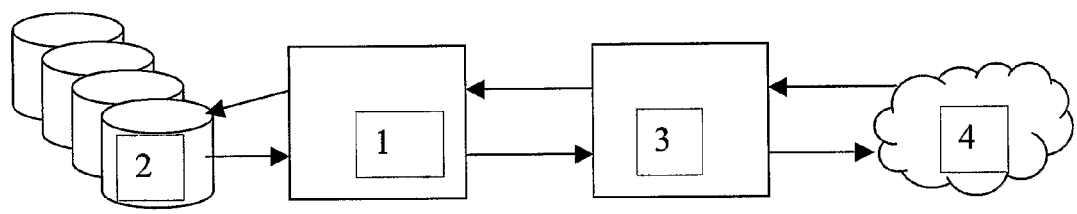
FIG. 1 schematically shows an overview of the context of a coordinating system according to an exemplary embodiment of the invention.

In FIG. 1 the context in which a coordinating system (1) according to an exemplary embodiment of the invention might be situated, is schematically depicted. Coordinating system (1) can be used to support management and maintenance of the cabling system of a telecommunication network (4). The network (4) comprises a multitude of physical connections between a multitude of nodes, formed by cables. Each cable comprises a number of wires, usually grouped together in pairs, wire pairs. The coordinating system (1) is linked to and uses data from one or several existing databases (2). Based on an analysis of the data retrieved from the one or more databases (2) the system (1) generates a detailed work order for an engineer to perform measurements with the mapping system (3). The mapping system (3) is a system that performs measurements on the connections within the telecommunication network (4) and compares the results of these measurements with the data in one of the databases (2). The mapping system (3) can be physically linked to telecommunication network (4) when the mapping system performs measurements. The mapping system (3) is not permanently linked to the telecommunication network (4). The coordinating system (1) can be physically linked to the mapping system (3). But it can also be disconnected. Differences are reported to coordinating system (1), this can be done directly in case the mapping system (4) is physically linked to the coordinating system (1), or by downloading the report to a file, which has to be uploaded in the coordinating system (4) by the engineer.

How the coordinating system (1) operates is described with reference to FIG. 2.

Figure 2:
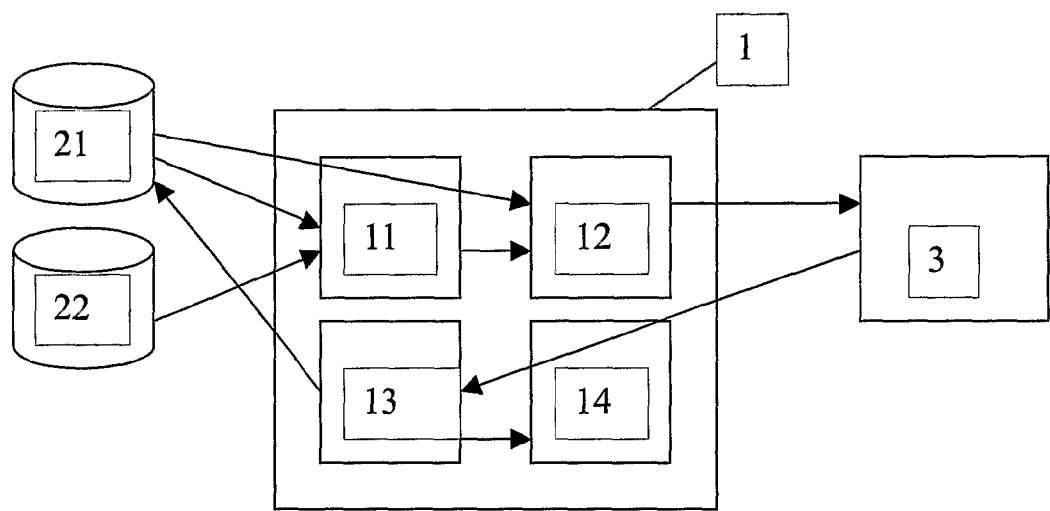
FIG. 2 schematically depicts a coordinating system according to an exemplary embodiment of the invention.

As shown in FIG. 2 the coordinating system (1) comprises a planning module (11), a work order module (12), a data processing module (13) and a management information module (14).

Periodically the planning module (11) retrieves from the network administration database (21) a file that contains cable utilization data. By comparing the previous period's cable utilization data with the retrieved file, it is possible to calculate how many changes have occurred in the cables. The planning module (11) additionally retrieves periodically from the customer care database (22) a file that contains telephone numbers. These telephone numbers are reported because over the past period they have generated after care based on a subscriber complaint as a result of faults/obstructions in the access network. The file containing telephone numbers is offered to network administration database (21) and with each telephone number the network administration database (21) provides a "Route through the access network", indicating which cables are used by this telephone number. Using the received "Route through the access network" data, the planning module (11) calculates which cables have received aftercare in the past month.

Using the number of changes per cable and amount of aftercare per cable, the planning module (11) calculates a ranking of telephone switch areas where, relatively speaking, numerous problems have occurred in the past month. The ranking list is calculated by using a formula such as: $((A \times Y1 + B \times Y2)/C) \times 100\%$ Where:
A=number of subscriber complaints in previous period;
B=number of changes in previous period;
C=number of lines in service in previous period;
Y1=correction factor 1, range 0.0 . . . 1.0;
Y2=correction factor 2, range 0.0 . . . 1.0.

This ranking of telephone switch areas supports the decision in which telephone switch area the need for cleaning up is most urgent.

A user of coordinating system (1), and more specifically planning module (11) can zoom in on a contaminated telephone switch area the system presents the cables together with the numbers of changes and amount of aftercare. After zooming in on one specific cable, the user is presented with an overview of the quantities of aftercare and changes for each wire pair of that specific cable. Using the wire pair series, it is possible to identify cable distributors that have undergone numerous changes and/or considerable aftercare. This detailed information supports the decision what cable and wire pair needs to be cleaned up most urgently.

Now the user has determined which cable and wire pairs must be cleaned up and in which telephone switch area, it is possible to enter the cables/wire pair series in work orders. This is done by the work order module (12). As soon as a cable code/cable distributor has been placed in an order, the work order module asks network administration database (21) for the access network data of the relevant cable code/cable distributor.

After the access network data has been received, the data can be downloaded to the mapping system (3) and the engineer can proceed with the mapping system (3) to the relevant telephone switch area so as to test the selected part of the access network.

On completion of the test, the engineer enters the downloaded file in the mapping system (3), which in turn executes the comparison of the network administrative data (as represented in the downloaded file) versus the physical situation. The mapping system (3) supplies to the coordinating system, more specifically to the data processing module (13) the differences identified through the comparison. Together with the work order filled in by the engineer in the work order module (12), the mapping system (3) file is uploaded and the differences are grouped.

After the grouping has been completed, it is possible by means of the work order to retrieve the found differences or, per work order, the differences per group. A user who zooms in on the difference will be instructed by the data processing module (13) which standard actions must be carried out to resolve the difference. The work order can be reported completed and the work order data together with the associated actions will be compressed and sent to the management information module (14), where the information will be converted for management and statistical purposes. It will be understood by those skilled in the art that the present invention is not limited to the embodiments illustrated above and that modifications and additions may be made without departing from the scope of the invention as defined in the appending claims.

The invention claimed is:

1. System for automatically coordinating the use of a mapping system comparing the physical connection status of a cable link in a network with the administrative data about the cable link in the network administration, comprising:
   a planning module for determining which cable link needs to be handled by said mapping system;
   a work order module for generating a work order comprising detailed instructions to said mapping system, and;
   a data processing module for analyzing the results of said mapping system, and indicating the required action to solve differences reported by said mapping system.

2. The system of claim 1 wherein said planning module identifies which cable link needs to be handled by said mapping system based on information from one or more existing databases.

3. The system of claim 2 wherein said databases comprise:
   information with regard to the number of changes in the utilization data of each cable link and;
   information with regard to the number of after care requests for each cable link.

4. The system of claim 1 also comprising:
   a management information module providing statistical information with regard to the network management actions performed with the support of said coordinating system.

5. Method for coordinating the use of a mapping system comparing the physical connection status of a cable link in a network with the administrative data about said cable link in the network administration, comprising the steps of:
   determining which cable link needs to be handled by said mapping system;
   generating a detailed work order to said mapping system;
   performing the measurements on said cable link with said mapping system and;
   analyzing the results of said mapping system, resulting in actions to solve the differences reported by said mapping system.

6. Method according to claim 5 wherein the step of identifying which cable link needs to be handled by said mapping system comprises the steps of:
   retrieving from a database a file containing information with regard to the number of changes in the utilization data of each cable link and;
   retrieving from another database information with regard to the number of after care requests for each cable link.

* * * * *